(12) United States Patent
Magistretti et al.

(10) Patent No.: US 7,872,326 B2
(45) Date of Patent: Jan. 18, 2011

(54) ARRAY OF VERTICAL BIPOLAR JUNCTION TRANSISTORS, IN PARTICULAR SELECTORS IN A PHASE CHANGE MEMORY DEVICE

(75) Inventors: Michele Magistretti, Gessate (IT);
Fabio Pellizzer, Cornate D'Adda (IT);
Augusto Benvenuti, Lallio (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 446 days.

(21) Appl. No.: 12/037,766

(22) Filed: Feb. 26, 2008

(65) Prior Publication Data

US 2008/0203379 A1 Aug. 28, 2008

(30) Foreign Application Priority Data

Feb. 28, 2007 (EP) ................................. 07425107

(51) Int. Cl.
*H01L 29/02* (2006.01)
(52) U.S. Cl. .................... 257/517; 257/5; 257/E27.055; 257/E27.076; 257/E29.03; 257/E29.033; 257/E29.034; 257/E29.114; 257/E21.608; 257/E45.002; 438/309; 438/318; 438/315; 438/353; 438/355; 438/359
(58) Field of Classification Search ................. 438/309, 438/315, 318, 340, 353, 355, 359
See application file for complete search history.

(56) References Cited

U.S. PATENT DOCUMENTS

| | | | |
|---|---|---|---|
| 4,933,736 | A | 6/1990 | Conner et al. |
| 7,227,171 | B2 | 6/2007 | Bez et al. |
| 2002/0079483 | A1 | 6/2002 | Dennison |
| 2002/0079524 | A1 | 6/2002 | Dennison |
| 2002/0081807 | A1 | 6/2002 | Xu |
| 2007/0051936 | A1 | 3/2007 | Pellizzer et al. |

FOREIGN PATENT DOCUMENTS

| | | | |
|---|---|---|---|
| EP | 0224857 | A1 | 6/1987 |
| EP | 1318552 | A1 | 6/2003 |
| EP | 1408550 | A1 | 4/2004 |
| WO | 03073511 | A1 | 9/2003 |

*Primary Examiner*—Savitri Mulpuri
*Assistant Examiner*—Yasser A Abdelaziez
(74) *Attorney, Agent, or Firm*—Lisa K. Jorgenson; Robert Iannucci; Seed IP Law Group PLLC

(57) ABSTRACT

A process for manufacturing an array of bipolar transistors, wherein deep field insulation regions of dielectric material are formed in a semiconductor body, thereby defining a plurality of active areas, insulated from each other and a plurality of bipolar transistors are formed in each active area. In particular, in each active area, a first conduction region is formed at a distance from the surface of the semiconductor body; a control region is formed on the first conduction region; and, in each control region, at least two second conduction regions and at least one control contact region are formed. The control contact region is interposed between the second conduction regions and at least two surface field insulation regions are thermally grown in each active area between the control contact region and the second conduction regions.

21 Claims, 10 Drawing Sheets

ARRAY OF VERTICAL BIPOLAR JUNCTION TRANSISTORS, IN PARTICULAR SELECTORS IN A PHASE CHANGE MEMORY DEVICE

BACKGROUND

1. Technical Field

The present invention relates to an array of vertical bipolar junction transistors. In particular, the invention may be advantageously used to form an array of selectors in a phase change memory device, without however being limited thereto.

2. Description of the Related Art

As is known, phase change memories are formed by memory cells connected at the intersections of bitlines and wordlines and comprising each a memory element and a selection element. A memory element comprises a phase change region made of a phase change material, i.e., a material that may be electrically switched between a generally amorphous and a generally crystalline state across the entire spectrum between completely amorphous and completely crystalline states.

Typical materials suitable for the phase change region of the memory elements include various chalcogenide elements. The state of the phase change materials is non-volatile, absent application of excess temperatures, such as those in excess of 150° C., for extended times. When the memory is set in either a crystalline, semi-crystalline, amorphous, or semi-amorphous state representing a resistance value, that value is retained until reprogrammed, even if power is removed.

Selection elements may be formed according to different technologies, for example they can be implemented by diodes, by MOS transistors or bipolar transistors.

U.S. Pat. No. 7,227,171 discloses a method for manufacturing bipolar type selection transistors in a phase change memory device. Although the process described therein is satisfactory, it is susceptible of improvement, in particular as regards the emitter formation. Furthermore, this known process does not provide for salicided junctions of the selection transistors, but only of the circuitry transistors.

To improve the above process, the inventors have devised a process including defining, in a semiconductor body, a plurality of active areas delimited by field insulation regions; forming a plurality of base regions in the active areas; forming a plurality of silicide protection strips extending transversely to the field insulation regions above the semiconductor body; forming a plurality of emitter regions in each active area on a first side of the silicide protection strips; forming base contact regions in each active areas on a second side of the silicide protection strips; and forming silicide regions on the emitter and base contact regions. Thus, in each active area, the silicide protection strips separate the emitter regions from the base contact regions.

However, with the continuous miniaturization of the circuits, there is the risk the lateral diffusion of the implants during the activation causes the emitter regions and the base contact regions to be very close or even short-circuited, thus causing unwanted leakages in the selection transistors.

This problem is clarified with reference to FIGS. 1-3, showing a portion of a memory device accommodating selection transistors. In these figures, a substrate 1 comprises a subcollector region 2 a first conductivity type (e.g., P+), a collector region 3 of the first conductivity type (here, P type) and a base region 4, overlying the collector region 3 and of a second conductivity type (here, N type). The subcollector region 2 and the collector region 3 extend at least in part below the field oxide regions 6 and are common to and shared by the entire memory device. The base regions 4 have a strip-like form and extend each in an own active area 5 of the matrix. The active areas 5, as visible from the top view of FIG. 1, have also a strip-like shape and are insulated from each other by field oxide regions 6 obtained by STI (Shallow Trench Insulation).

Above the surface of the substrate 1, silicide protection regions 10, e.g., of silicon nitride, extend perpendicularly to the field oxide regions 6; in each active area 5, base contact regions 11, of N+ type, extend within the base region 4 on one side of each silicide protection region 10 and emitter regions 12, of P type, extend within the base region 4 on the other side of each silicide protection region 10, so that each base contact region 11 is separated by the neighboring emitter regions 12 by a silicide protection region 10.

The base contact regions 11 and the emitter regions 12 are covered by silicide regions 15 and the surface of the substrate 1 is covered by a dielectric layer 16. Base plugs 17 and emitter plugs 18 extend through the dielectric layer 16 for electrically connecting the base contact regions 11 and the emitter regions 12, respectively.

In the described structure, the silicide protection regions 10 may have a width of 100 nm; the plugs 17 and 18 may have a width of 80 nm, the distance between adjacent silicide protection regions 10 may be 120 nm. With the indicated dimensions, considering the lateral diffusion of the doping agents and possible mask misalignments (FIG. 1 also shows the emitter implant mask 19), there is the risk that the base contact regions 11 and the emitter regions 12 come into contact and behave like Zener diodes, giving rise to current leakages, which is undesired.

US 2002/0081807 discloses a phase-change memory device having a dual trench isolation, wherein each selection element (a diode) is isolated from the adjacent ones in both directions by shallow trench regions. The upper region of the selection element is silicided. US 2002/0079483 and US 2002/0079524 disclose other phase-change memory devices having a dual trench isolation. These processes are particularly burdensome and cannot be used to manufacture transistors having at least two terminals connected to upper metal layers.

BRIEF SUMMARY

One embodiment is a process for manufacturing bipolar junction transistors overcoming the shortcomings of the prior art.

According to one embodiment, there is provided a method for manufacturing an array of bipolar junction transistors, as well as an array of bipolar junction transistors, as defined in claims 1 and 9, respectively.

BRIEF DESCRIPTION OF THE SEVERAL VIEWS OF THE DRAWINGS

For the understanding of the present invention, preferred embodiments are now described, purely as a non-limitative example, with reference to the enclosed drawings, wherein.

DETAILED DESCRIPTION

Figure 4:
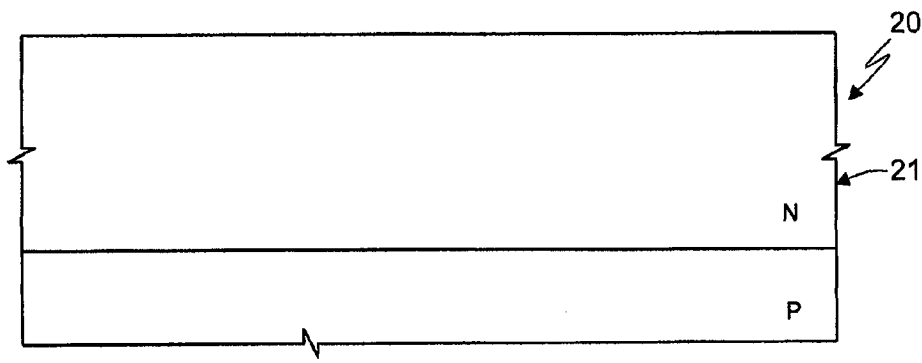
FIGS. 4, 5 and 7-13 are cross-sections, taken along the same plane of FIG. 2, of a semiconductor wafer during subsequent manufacturing steps according to a first embodiment of the invention.
Figure 5:
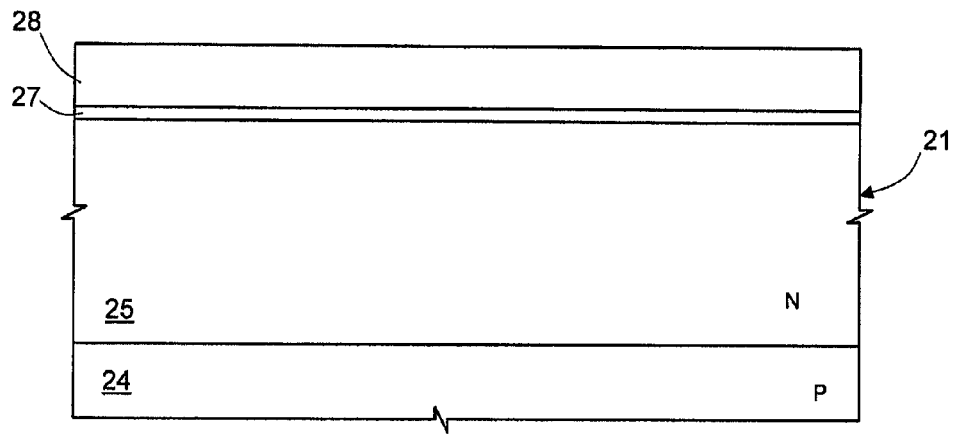

FIG. 4 shows a wafer 20 comprising a substrate 21 of silicon, wherein standard front-end steps have been already performed, including, as also disclosed in EP-A-1318 552, defining active areas 22 (see FIG. 6), e.g., using the "shallow trench" technology (to obtain deep field oxide regions, as shown at 26 in FIG. 6); implanting buried collector regions 24; and implanting N-type base regions 25 (FIG. 5).

Figure 6:
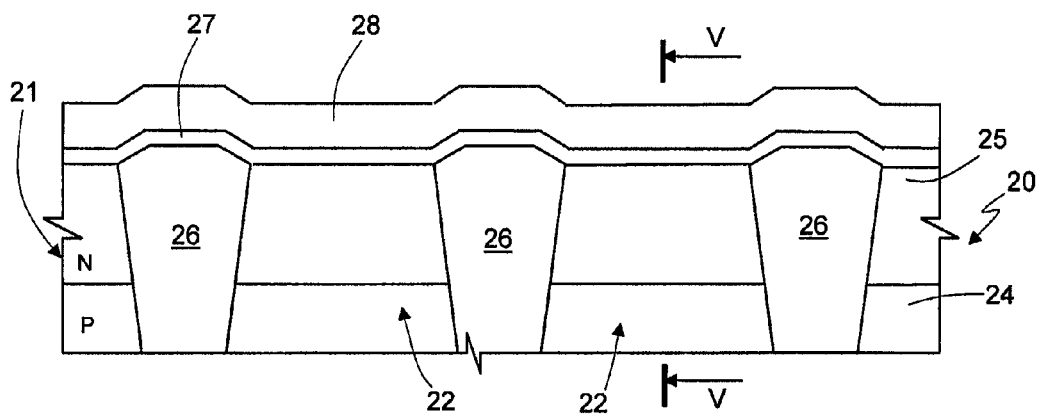
FIG. 6 is a cross-section, taken along a plane perpendicular to FIG. 5, in the same manufacturing step.
Figure 7:
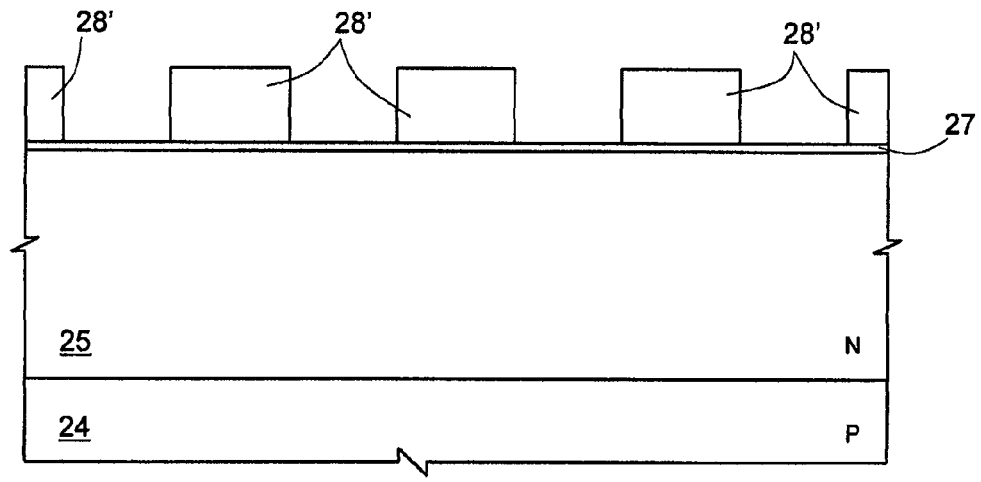

Thereafter, FIGS. 5 and 6, a thin oxide layer 27 and a nitride layer 28 are deposited. Then, FIG. 7, the nitride layer 28 is patterned, using a resist mask not shown, to form a hard mask 28'. In particular, the nitride layer 28 may be dry etched using a process that is selective toward silicon, followed by stripping. The hard mask 28' includes a plurality of strips, extending transversely, e.g., perpendicularly, to the deep field oxide regions 26.

Figure 8:
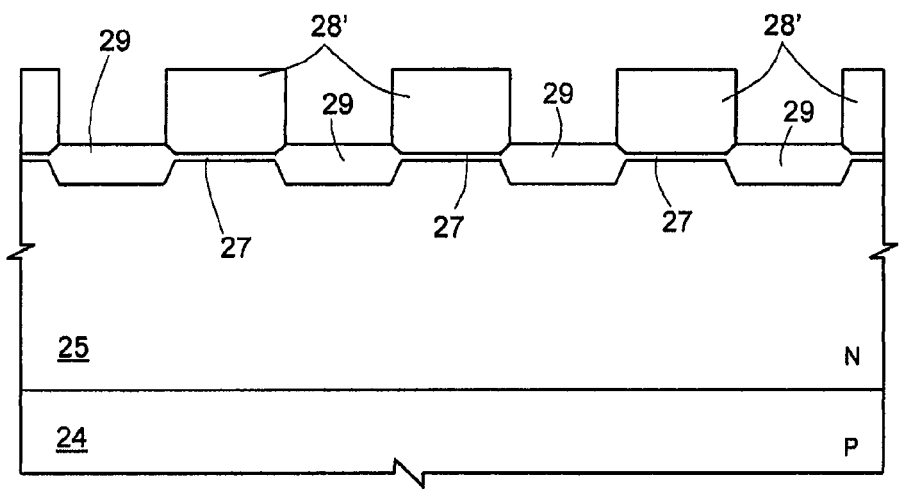

Using the hard mask 28', the wafer is subject to a thermal oxidation (LOCOS), thereby causing surface field oxide regions 29 to grow in the active areas 22, partly within the substrate 20, where the surface is not covered by the hard mask 28', FIG. 8. The surface field oxide regions 29 are thus strip-shaped and shallower than the deep field oxide regions 26 and extend through only a surface portion of each base region 25. For example, the surface field oxide regions 29 may have a depth of 80 nm.

Figure 9:
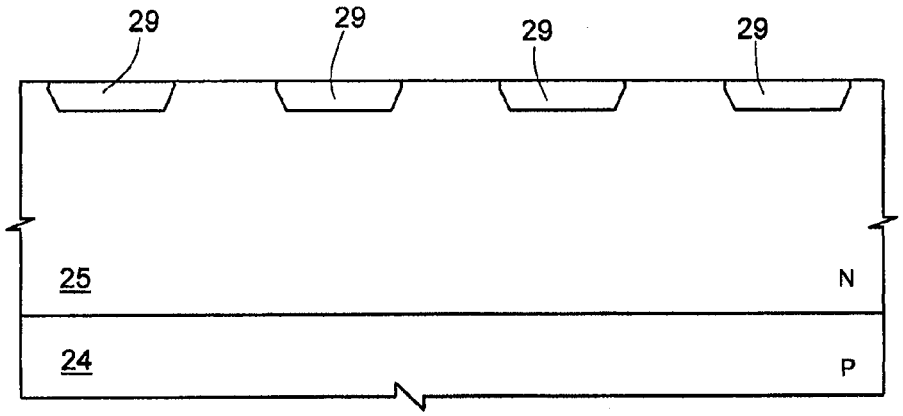

Using a wet process and phosphoric agent, FIG. 9, the hard mask 28' of nitride is removed, and then the oxide layer 27 is removed as well. Thereby, also the protruding part of the field oxide regions 29 is at least partially removed, thus substantially planarizing the surface.

Figure 10:
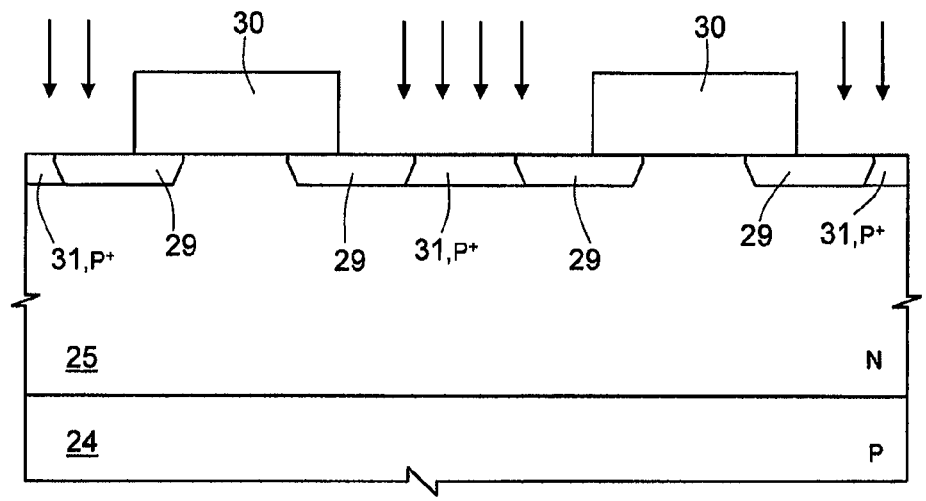

Then, FIG. 10, a P-implant protection mask 30, of resist, is formed on the surface of the substrate 21, by spinning, exposing and developing a photoresist layer. The P-implant protection mask 30 comprises a plurality of strips extending parallel to the surface field oxide regions 29 but offset thereto so as to cover the surface of the substrate 21 between pairs of surface field oxide regions 29, as well as part of the latter. Then, an emitter implant with boron is performed, thereby forming emitter regions 31. The emitter regions 31 may have a depth of 20 nm, thus are shallower or at least not deeper than the surface field oxide regions 29.

Figure 11:
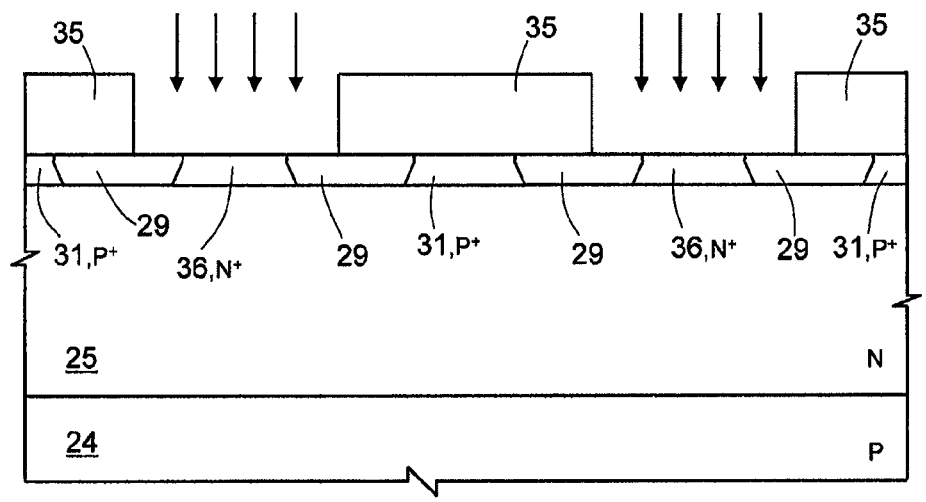

Subsequently, FIG. 11, after removing the P-implant protection mask 30, an N-implant protection mask 35 is formed, which covers the emitter regions 31 (in practice, the implant protection mask 35 is a negative of the P-implant protection mask 30). Then, an N$^+$-implant with arsenic is carried out, thereby forming base contact regions 36. Accordingly, the base contact regions 36 are arranged alternately to the emitter regions 31 on two opposed sides of each surface field oxide regions 29 in each active area. The base contact regions 36 may have a depth of 40 nm, thus are shallower or at least not deeper than the surface field oxide regions 29. Thereby, the surface field oxide regions 29 separate the emitter regions 31 from the base contact regions 36.

Figure 12:
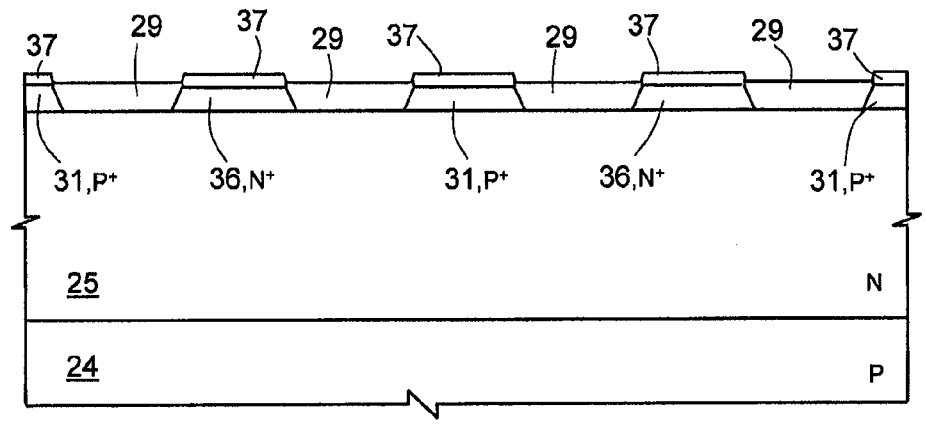

After removing the N-implant protection mask 35 and performing an implant activation/diffusion step in RTP (Rapid Temperature Process) at a temperature comprised between 900 and 1100° C., salicide regions 37 are formed, in a per se known manner, over the emitter regions 31 and the base contact regions 36, FIG. 12.

Figure 13:
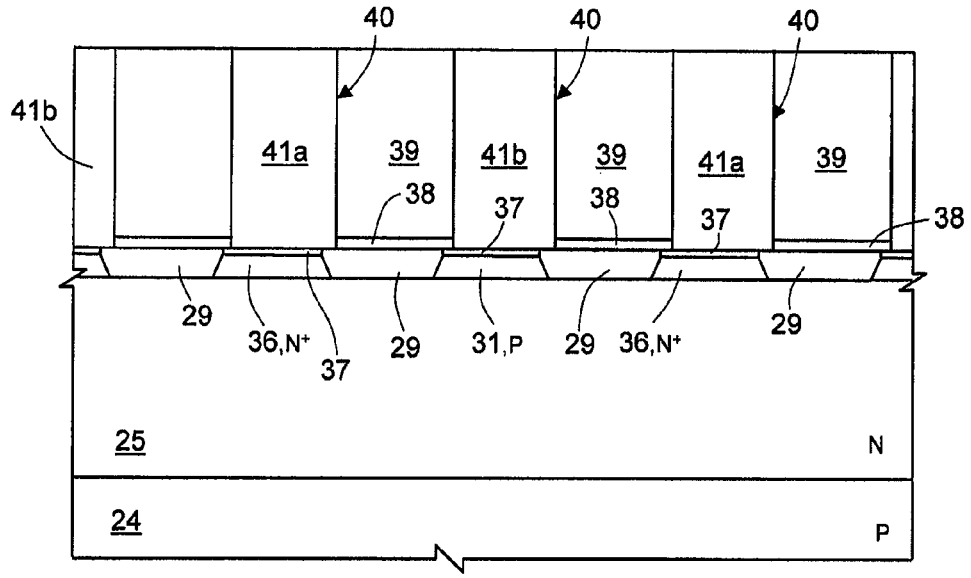

Then, FIG. 13, a nitride layer 38 (preferably, with a thickness of 20 nm) and a first dielectric layer 39 (preferably, USG—Undoped Silicate Glass—with a thickness of 700 nm) are deposited and planarized down to about 600 nm. Using a resist mask not shown, the dielectric layer 40 and the nitride layer 38 are etched where contacts are to be formed so as to form openings 40 that reach the silicide regions 37. The apertures 40 are filled by a contact material to form plugs or contacts 41a and 41b; e.g., filling may envisage depositing a barrier layer, e.g., a multiple Ti/TiN layer, and a tungsten layer, and then planarizing the deposited layers.

Finally, back end steps or the steps to form the memory elements are carried out. In the latter case, for example, the process described in U.S. Patent Application Publication No. 2007/051936 may be used, to obtain the final structure of FIGS. 14 and 15, taken respectively in the direction of the wordlines and in the direction of the bit-lines.

Figure 14:
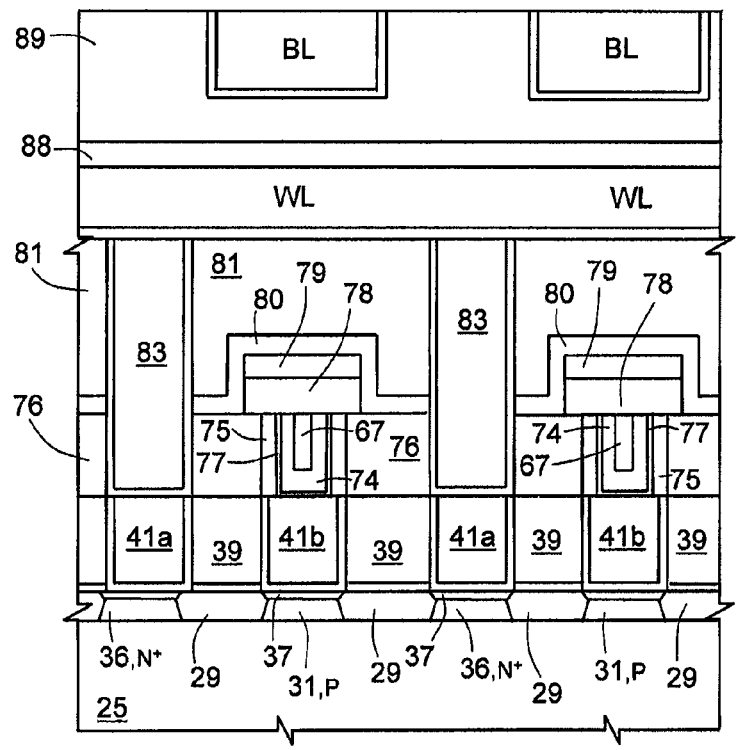
FIG. 14 is a cross-section of a phase change memory using the array of transistor manufactured using the process of FIGS. 4-13.

In detail, a second dielectric layer 76 is deposited; openings are formed in the second dielectric layer 76 above the emitter regions 31; a spacer layer 75 of silicon nitride is formed on the walls of the openings; a heater layer 77 and a sheath layer 74 are subsequently deposited to cover the walls and the bottom of the openings; a third dielectric layer 67 is deposited to fill the openings; and the wafer is planarized. Accordingly, the heaters 77 are generally cup-shaped. In FIG. 14, the heaters 77 extend on first-level plugs 41b which are in electrical contact with the emitter regions 31. Next, a chalcogenic layer 78 of GST (Ge$_2$Sb$_2$Te$_5$), and a metal layer 79 are deposited and defined to form resistive bit lines, which run perpendicularly to the plane of FIG. 14. Metal lines 79 thus create a first metal level.

Then, a sealing layer 80 and a fourth dielectric layer 81 are deposited; holes are opened, coated with a barrier layer and filled by a metal layer 83 or 84, of Cu.

Figure 15:
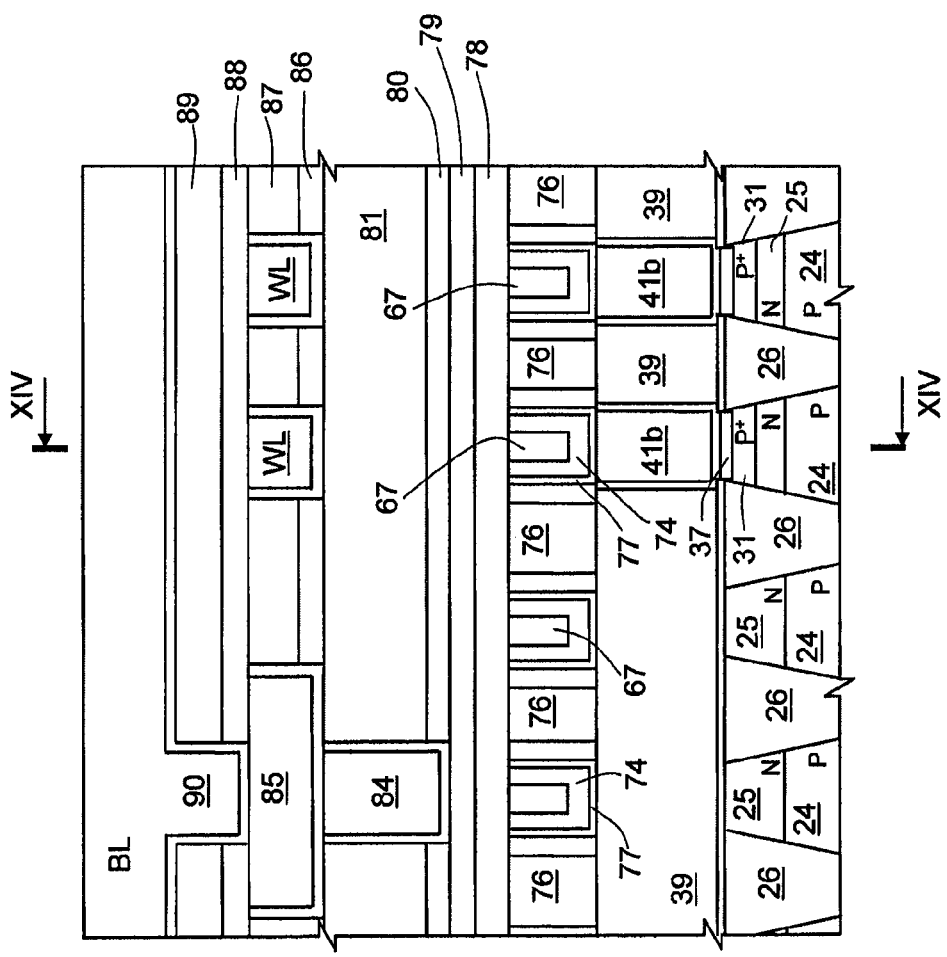
FIG. 15 is a cross-section of the phase change memory of FIG. 14, taken along a perpendicular plane.

Thus, the cross-section of FIG. 14 shows second-level, base plugs 83 which extend through the layers 76, 80 and 81 to contact the first-level plugs 41a and, thus, the base contact regions 36; FIG. 15 show second-level, intermediate plugs 84 extending through the layers 80 and 81 to contact the first metal layer 79.

Then, wordlines WL, from a second metal layer, are formed on the fourth dielectric layer 81 in electrical contact with the second-level, base plugs 83 and thus the base region 25, through the first-level plugs 41a and the base contact regions 36; conductive regions 85 are formed from the same second metal layer as the wordline WL, as visible from FIG. 15, and are in electrical contact with the second-level, intermediate plugs 84 to allow electrical connections between the latter and bit-lines BL.

The wordlines WL and the conductive regions 85 are insulated from each other by a second nitride layer 86 and a fifth dielectric layer 87 (FIG. 15).

A third nitride layer 88 and a sixth dielectric layer 89 are formed on the fifth dielectric layer 87, the wordlines WL and the conductive regions 85; bit lines BL of conductive material are formed in the sixth dielectric layer 89 from a third metal layer; vias 90 connect the bitlines BL to the conductive regions 85.

Figure 16:
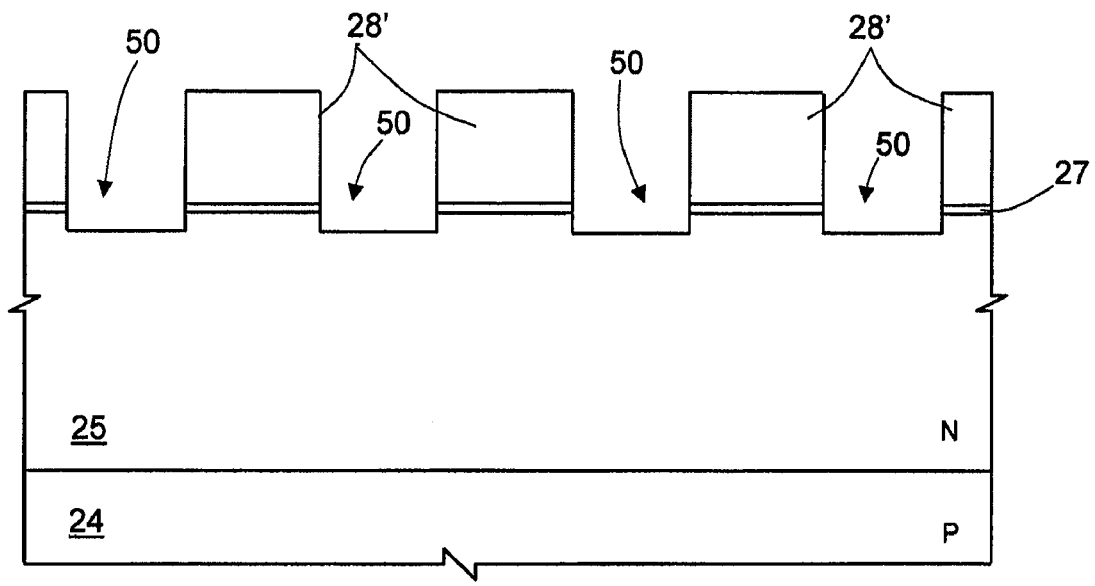
FIGS. 16 and 17 are cross-sections, taken along the same plane of FIGS. 7-8, of a semiconductor wafer according to a second embodiment of the invention.
Figure 17:
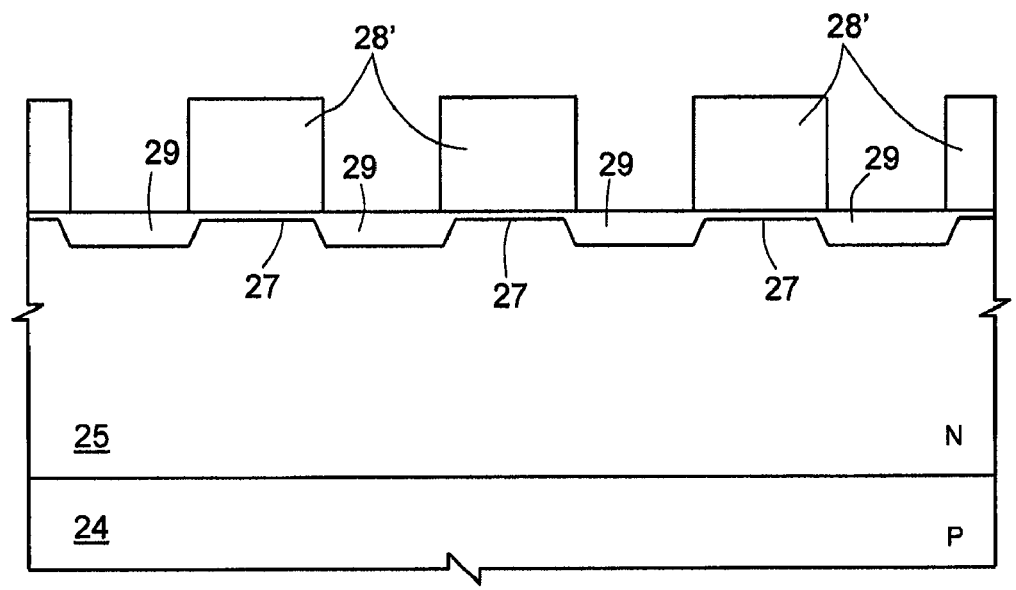

FIGS. 16 and 17 show an embodiment wherein the surface field oxide regions 29 are grown in recesses of the substrate 20 (recessed LOCOS technique). In detail, after forming the hard mask 28' (FIG. 7), the thin oxide layer 27 and a surface portion of the substrate 21 are etched, thereby forming recesses 50 having a depth of 30 nm, FIG. 16. Then, thermal growth of oxide follows, forming the surface field oxide regions 29 that fill the recesses 50 and are approximately planar with the surface of the substrate 21. Then, the steps discussed with reference to FIGS. 9-15 are performed. The resulting structure has a better planarity than that obtainable with the embodiment of FIGS. 7-8.

Figure 1:
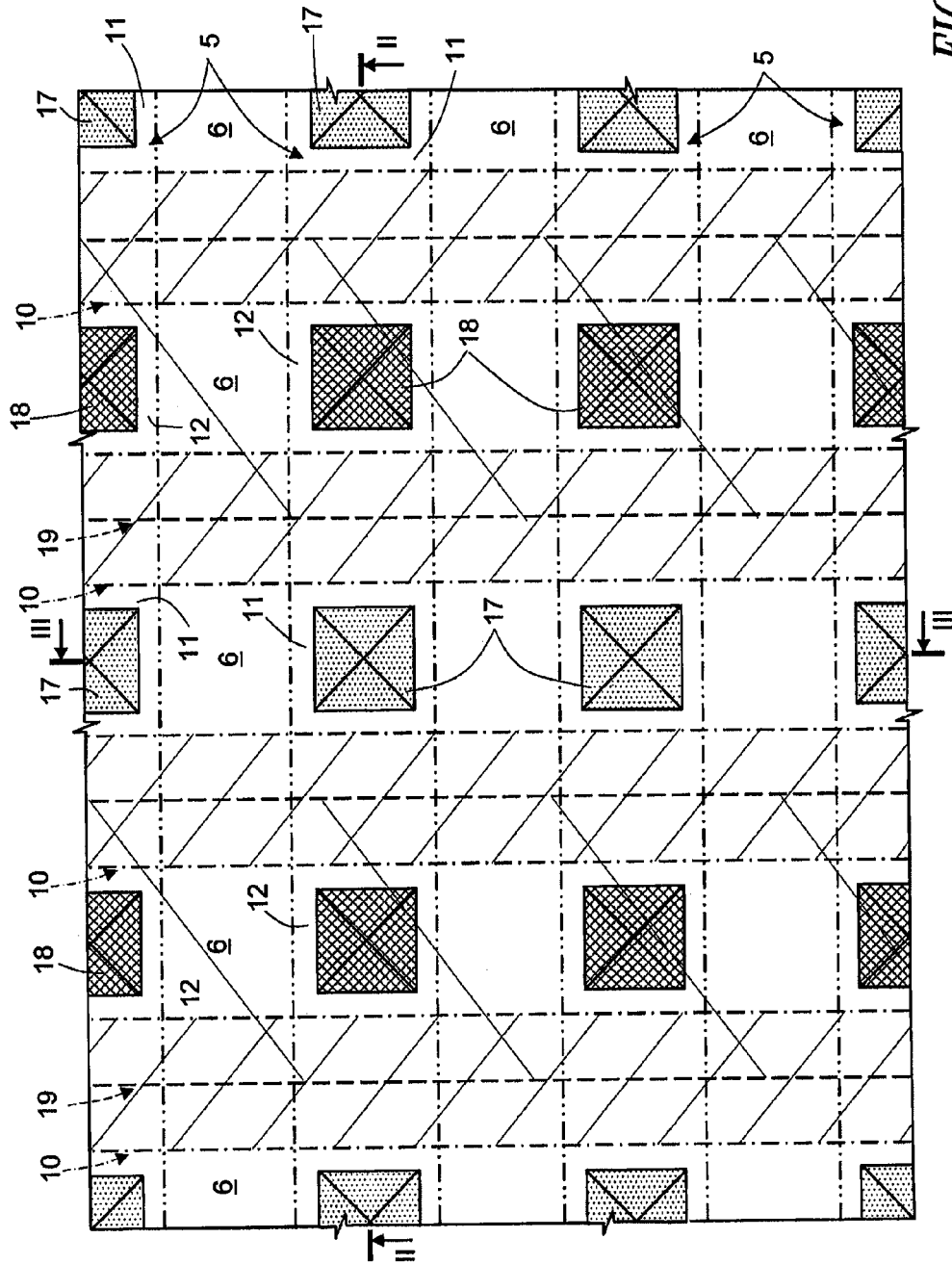
FIG. 1 illustrates a top view of a previously devised array.
Figure 2:
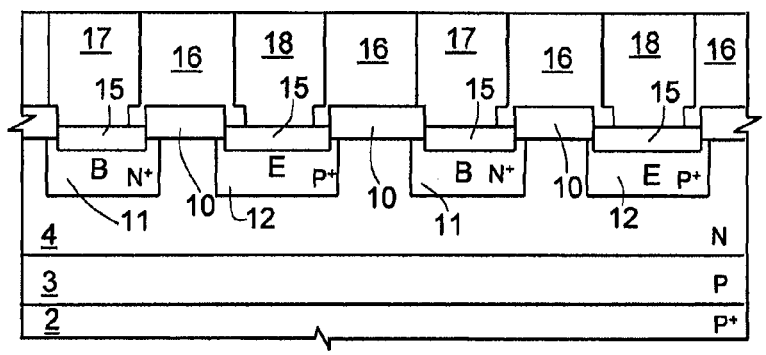
FIGS. 2 and 3 are cross-sections of the array of FIG. 1, taken along lines II-II and III-III, respectively.
Figure 3:
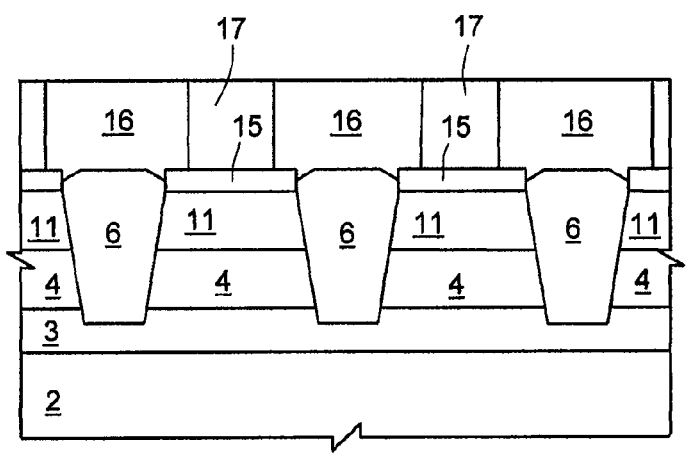
Figure 18:
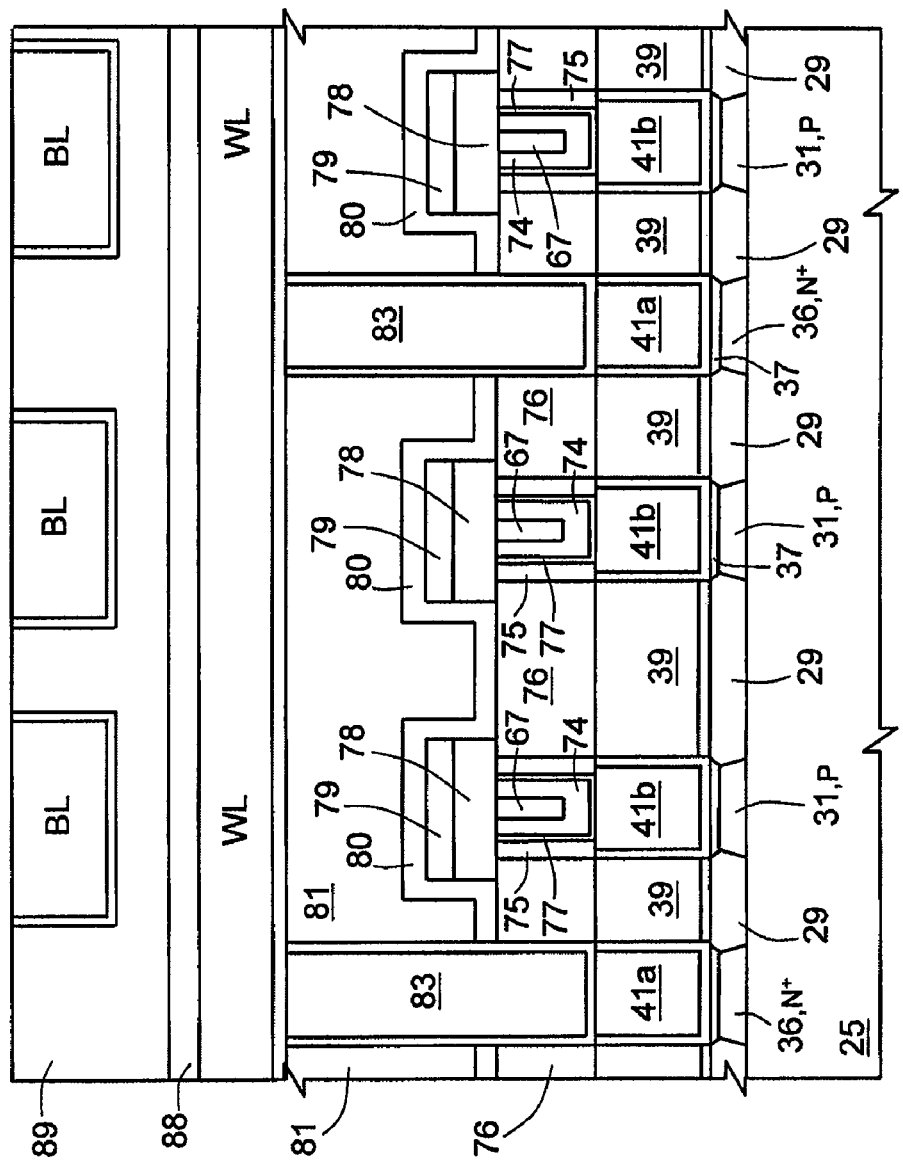
FIG. 18 is a cross-section, taken along the same plane of FIG. 14, of a phase change memory according to a third embodiment of the invention.

FIG. 18 shows an embodiment wherein each base contact region 36 is formed every two emitter regions 31, so that couples of adjacent emitter regions 31 are spaced only by a surface field oxide region 29. Thus, each base contact region 36 forms two bipolar transistors with the adjacent emitter regions 31. In addition, analogously to the solution of FIGS. 2 and 3 and to the embodiments of FIGS. 4-17, each base region 25 has a strip-like form and extends in an own active area 22 (FIG. 6) of the array. Thus, in the direction of the worldlines WL, the base region 25 is shared by all the adjacent selection transistors and are insulated from each other by the deep field oxide regions 26.

Figure 19:
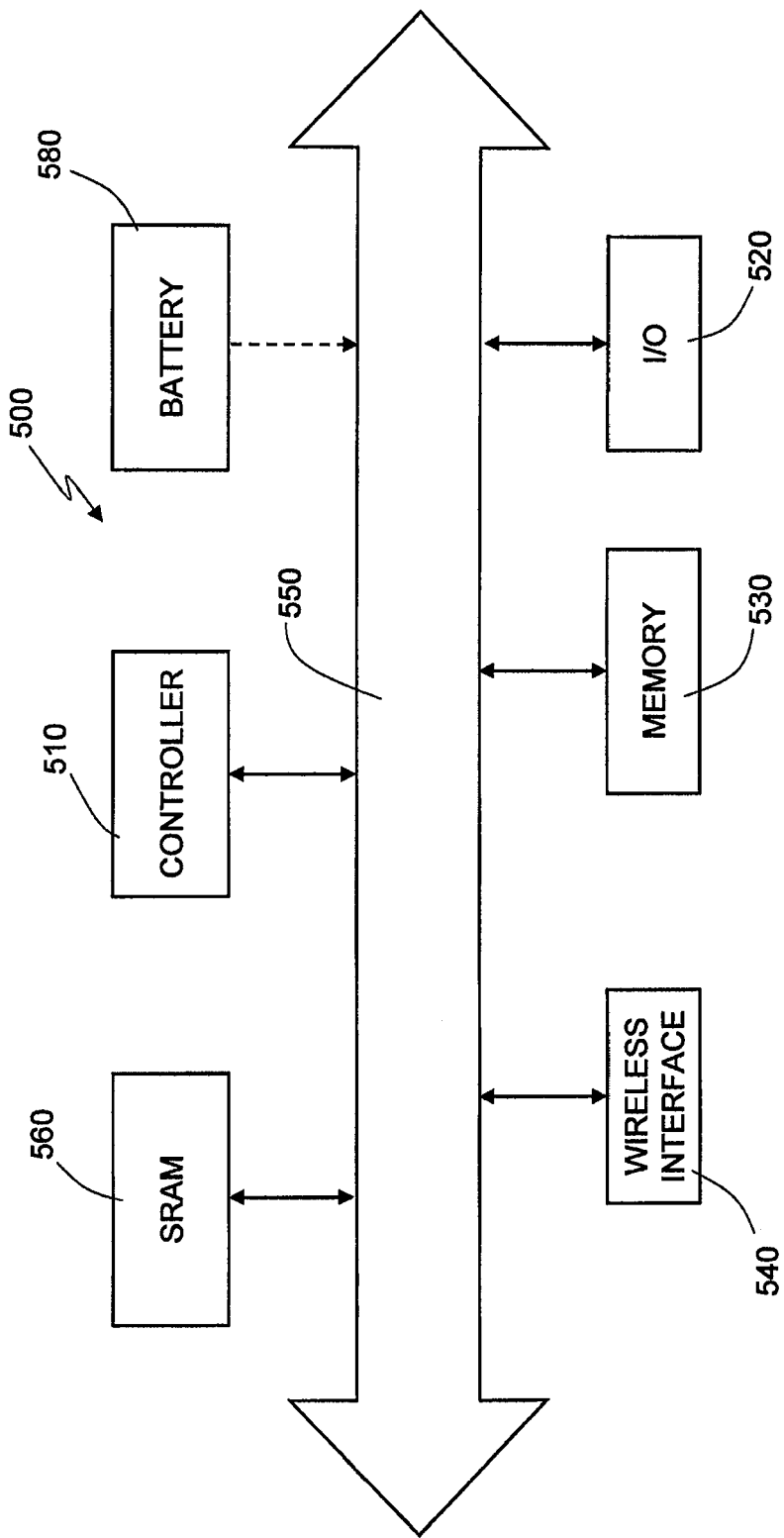
FIG. 19 is a system depiction for another embodiment of the invention.

Turning to FIG. 19, a portion of a system 500 in accordance with an embodiment of the present invention is described. System 500 may be used in wireless devices such as, for example, a personal digital assistant (PDA), a laptop or portable computer with wireless capability, a web tablet, a wireless telephone, a pager, an instant messaging device, a digital music player, a digital camera, or other devices that may be adapted to transmit and/or receive information wirelessly. System 500 may be used in any of the following systems: a wireless local area network (WLAN) system, a wireless personal area network (WPAN) system, a cellular network, although the scope of the present invention is not limited in this respect.

System 500 includes a controller 510, an input/output (I/O) device 520 (e.g., a keypad, display), static random access memory (SRAM) 560, a memory 530, and a wireless interface 540 coupled to each other via a bus 550. A battery 580 is used in some embodiments. It should be noted that the scope of the present invention is not limited to embodiments having any or all of these components.

Controller 510 comprises, for example, one or more microprocessors, digital signal processors, microcontrollers, or the like. Memory 530 may be used to store messages transmitted to or by system 500. Memory 530 may also optionally be used to store instructions that are executed by controller 510 during the operation of system 500, and may be used to store user data. Memory 530 may be provided by one or more different types of memory. For example, memory 530 may comprise any type of random access memory, a volatile memory, a non-volatile memory such as a flash memory and/or a memory such as memory discussed herein.

I/O device 520 may be used by a user to generate a message. System 500 uses wireless interface 540 to transmit and receive messages to and from a wireless communication network with a radio frequency (RF) signal. Examples of wireless interface 540 may include an antenna or a wireless transceiver, although the scope of the present invention is not limited in this respect.

The advantages of the described embodiments are clear from the above description. In particular, it is pointed out that the transistor array has a good separation between the base contact regions 36 and the emitter regions 31, since they are isolated in both directions, either by the deep field oxide regions 26 or the surface field oxide regions 29 (inside each active area 22).

The process is simple, can be performed using standard manufacturing machinery and is well controllable, by virtue of the implants being self-aligned. In particular, the surface field oxide regions 29 ensure a confinement of the base contact and emitter implants, whose lateral diffusion during activation is limited; furthermore, the same surface field oxide regions 29 ensure a confinement of silicide regions 37.

The formation of the surface field oxide regions 29 through the LOCOS technique has the advantage of avoiding possible shorts typical of dual trench isolation, because pure LOCOS does not require a silicon etch and, in the case of recessed LOCOS, the oxidation removes possible residuals of silicon along the surface isolation trench.

The formation of the salicide regions 37 after growing the surface field oxide regions 29 and forming the base contact regions 32 and the emitter regions 31 has the advantage of helping the dielectric etch landing on the emitter and base contact without damaging them. Moreover the salicide guarantees a low contact resistance.

Finally, it is clear that numerous variations and modifications may be made to the process described and illustrated herein, all falling within the scope of the invention. In particular, the invention, although described with reference to the manufacture of a phase change memory device, may be used to any application wherein an array of bipolar junction transistor is used and a confinement of the conducting regions is sought.

Furthermore, the surface field oxide regions 29 may be grown before forming the deep field oxide regions 26, thus exchanging the order of forming the field oxide regions 26, 29.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:
1. A process, comprising:
   manufacturing an array of bipolar transistors in a semiconductor body having a surface, the manufacturing including:
      forming deep field insulation regions of dielectric material in said semiconductor body, thereby defining a plurality of active areas, insulated from each other;
      forming at least three bipolar transistors in each active area, including:
         forming a first conduction region extending at a distance from said surface, forming, in each active area, a control region on said first conduction region, forming, in each control region, a plurality of second conduction regions, and forming, in each control region, a plurality of control contact regions, each control contact region being interposed between two adjacent second conduction regions, forming a plurality of surface field insulation regions in each active area between the control contact region and the second conduction regions, the surface field insulation regions being shallower than deep field insulation regions.

2. A process according to claim 1, wherein forming the plurality of surface field insulation regions includes thermally growing the surface field insulation regions after forming the deep field insulation regions.

3. A process according to claim 1, wherein forming the surface field insulation-regions comprises digging recesses in said semiconductor body and performing a thermal process causing growing of said field insulation regions and filling of said recesses.

4. A process according to claim 1, wherein forming the surface field insulation regions is performed before forming second conduction regions and the control contact regions.

5. A process according to claim 4, comprising forming silicide regions on said second conduction regions and said control contact region.

6. A process according to claim 1, wherein forming the first conduction region comprises forming a common conduction region extending below said surface field insulation regions.

7. A process according to claim 1, comprising:

forming an insulating layer above said semiconductor body;

forming contact plugs extending through said insulating layer and in direct contact with said second conduction regions and said control contact region.

8. A process according to claim 7, comprising forming phase change memory elements above and in electrical contact with said second conduction regions through said contact plugs.

9. A process according to claim 1, comprising forming at least two consecutive second conduction regions on each side of each control contact region and forming a surface field insulation region between two consecutive second conduction regions.

10. An array of bipolar transistors comprising:

a semiconductor body having a surface;

deep field insulation regions of dielectric material in said body, said field insulation regions defining a plurality of active areas, isolated from each other; and at least three bipolar transistors in each active area, each bipolar transistor including a first conduction region, a control region and a second conduction region, said first conduction region extending in said semiconductor body at a distance from said surface, said control region extending on said first conduction region, wherein each active area accommodates:

a plurality of second conduction regions and a plurality of control contact regions, each control contact region interposed between two adjacent second conduction regions, said second conduction regions and said control contact region facing said surface, and a plurality of surface field insulation regions, said surface field insulation regions being interposed between said control contact region and said second conduction regions and being shallower than the deep field insulation regions.

11. An array according to claim 10, comprising silicide regions on said second conduction regions and said control contact region.

12. An array according to claim 10, wherein said first conduction region is common to said active areas and extends below said surface field insulation regions.

13. An array according to claim 10, comprising an insulating layer covering said semiconductor body and said surface field insulation regions; and contact plugs extending through said insulating layer and in direct contact with said second conduction regions and said control contact region.

14. An array according to claim 10, comprising phase change memory elements above and electrically coupled to said second conduction regions.

15. An array according to claim 10, wherein each control contact region has at least two consecutive conduction regions on each side and a surface field insulation region extends between two consecutive second conduction regions.

16. A system comprising:

a processor;

an input/output device coupled to said processor; and a memory coupled to said processor, said memory including an array of bipolar transistors that includes:

a semiconductor body having a surface;

deep field insulation regions of dielectric material in said body, said field insulation regions defining a plurality of active areas, isolated from each other; and at least three bipolar transistors in each active area, each bipolar transistor including a first conduction region, a control region and a second conduction region, said first conduction region extending in said semiconductor body at a distance from said surface, said control region extending on said first conduction region, wherein each active area accommodates:

a plurality of second conduction regions and a plurality of control contact region, each control contact region being interposed between two adjacent second conduction regions, said second conduction regions and said control contact region facing said surface, and a plurality of surface field insulation regions, said surface field insulation regions being interposed between said control contact region and said second conduction regions and being shallower than said deep field insulation regions.

17. A system according to claim 16, comprising silicide regions on said second conduction regions and said control contact region.

18. A system according to claim 16, wherein said first conduction region is common to said active areas and extends below said surface field insulation regions.

19. A system according to claim 16, comprising an insulating layer covering said semiconductor body and said surface field insulation regions; and contact plugs extending through said insulating layer and in direct contact with said second conduction regions and said control contact region.

20. A system according to claim 16, comprising phase change memory elements above and electrically coupled to said second conduction regions.

21. A system according to claim 16, wherein each control contact region has at least two consecutive conduction regions on each side and a surface field insulation region extends between two consecutive second conduction regions.

* * * * *